United States Patent [19]

Ulion et al.

[11] Patent Number: 5,262,245
[45] Date of Patent: Nov. 16, 1993

[54] ADVANCED THERMAL BARRIER COATED SUPERALLOY COMPONENTS

[75] Inventors: Nicholas E. Ulion, Marlborough; Neal P. Anderson, South Windsor, both of Conn.

[73] Assignee: United Technologies Corporation, Hartford, Conn.

[21] Appl. No.: 231,413

[22] Filed: Aug. 12, 1988

[51] Int. Cl.$^5$ ............................................. B32B 15/04
[52] U.S. Cl. ................................ 428/469; 428/472.2; 428/938; 427/532; 427/585
[58] Field of Search ...................... 428/680, 469, 472.2, 428/938; 427/532, 585

[56] References Cited

U.S. PATENT DOCUMENTS

| | | | |
|---|---|---|---|
| Re. 31,339 | 8/1983 | Dardi et al. | 428/680 |
| 3,890,956 | 6/1975 | Dils | 428/469 |
| 4,029,477 | 6/1977 | Grisik | 428/680 |
| 4,346,137 | 8/1982 | Hecht | 428/469 |
| 4,530,727 | 7/1985 | Thompson et al. | 428/469 |
| 4,743,514 | 5/1988 | Strangman et al. | 428/680 |

OTHER PUBLICATIONS

Fairbanks et al., "High-Rate Sputter Deposition of Protective Coatings on Marine Gas Turbine Hot-Section Superalloys," Jul., 1974, pp. 429–455.
D. Boone et al.: "Advanced Gas Turbine Coatings For Minimally Processed Coal Derived Liquid Fuels"; Fairbanks et al., editors: Dec. 1979.
R. E. Demaray, J. W. Fairbanks and D. H. Boone: "Physical Vapor Deposition of Ceramic Coatings for Gas Turbine Engine Components"; ASME 1982.
T. E. Strangman: "Thermal Barrier Coatings for Turbine Airfoils" Apr. 1984.
Battelle—Final Report Jan. 1985 "Combustion Zone Durability Program".
S. Shen: Technical Progress Report "Development of Improved Corrosion and Erosion Resistance Coatings for Gas Turbine Airfoils"—Reporting period: Oct. 1, 1979 to Apr. 30, 1980.
S. Shen: Final Progress Report "Development of Improved Corrosion and Erosion Resistance Coatings for Gas Turbine Airfoils"—Reporting period: Sep. 1, 1978 to Sep. 30, 1979.
E. Demaray: "Dedicated Electron Beam Reactive Physical Vapor Deposition (R.P.V.D.) Apparatus For The Production Of Ceramic Thermal Barrier Coatings" Project Final Report Dec. 1981.
Demaray et al., "Development of Electron Beam Physical Vapor Deposition of Ceramic Coatings"; Fairbanks et al. editors; May 1982.

Primary Examiner—Donald P. Walsh
Assistant Examiner—Daniel Jenkins
Attorney, Agent, or Firm—James M. Rashid

[57] ABSTRACT

An improved thermal barrier coating system is described. A key feature of the invention is the presence of a thin, adherent aluminum oxide scale on the surface of the substrate. An oxide stabilized ceramic coating is present on the surface of the scale. Preferably, the ceramic coating has a columnar grain structure.

6 Claims, 1 Drawing Sheet

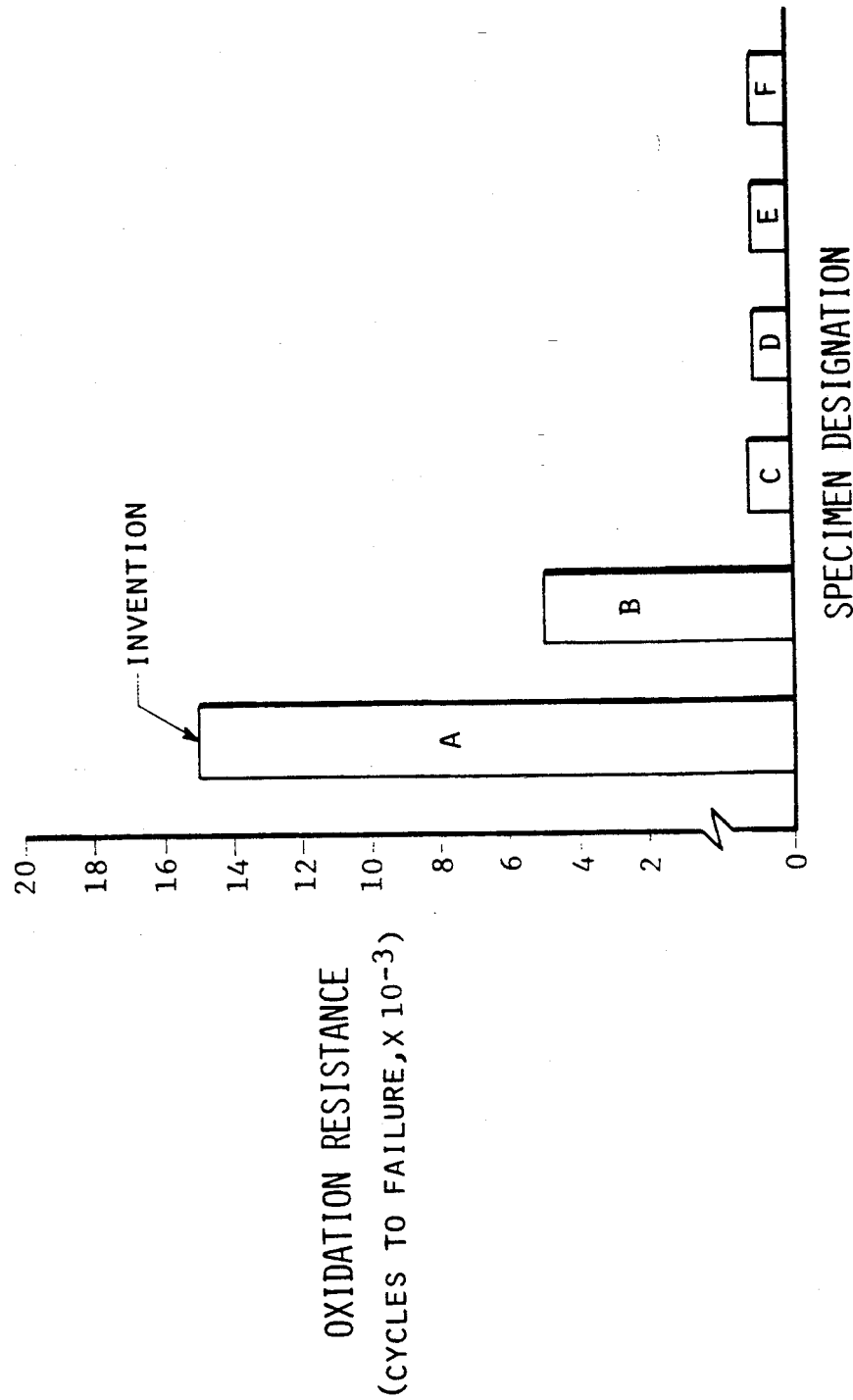

ADVANCED THERMAL BARRIER COATED SUPERALLOY COMPONENTS

DESCRIPTION

1. Technical Field

This invention pertains to superalloys and thermal barrier coatings.

2. Background Art

Ceramic thermal barrier coatings are widely used in the gas turbine engine industry. Their most common use is in the combustion section of the engine, applied to stationary (i.e., non-rotating) metal alloy components which define the combustion chamber. Alloys which are used to fabricate combustion chambers include, for example, those known as HASTELLOY Alloy X and HAYNES Alloy 188 (both registered trademarks of Cabot Corporation, Waltham, Mass., USA). The ceramic coating provides insulative shielding to the chamber, thereby allowing the combustion of fuel to take place at extremely high temperatures without causing degradation of the metallic substrate.

More recently, efforts have been directed towards developing thermal barrier coatings which can be applied to components in other sections of the engine. In particular, engineers have sought to apply thermal barrier coatings to blades and vanes used in the turbine section of the engine. These turbine section components are fabricated from alloys such as those described in U.S. Pat. No. 4,209,348 to Duhl et al, and are typically investment castings. Due to the high temperature and stress environment of the turbine section, turbine section components require periodic inspection and oftentimes, periodic replacement. If thermal barrier coatings could successfully be applied to such components, their life would be extended, thereby reducing the engine operating costs.

An example of a thermal barrier coating presently used on gas turbine engine combustion chambers is the coating described in U.S. Pat. No. 4,248,940 to Goward et al. This type of coating is actually a combination of two different coatings, one being a ceramic material and the other being a metallic material. The ceramic material is preferably an oxide stabilized zirconia such as yttria stabilized zirconia which is applied to the surface of the metallic material, preferably an MCrAlY-type bond coating, where M is nickel, cobalt, iron, or mixtures thereof. The bond coating is present on the surface of the substrate, and provides the substrate with resistance to oxidation degradation. Such protection is necessary in order to achieve a thermal barrier coating system (i.e., the combined ceramic and metallic coatings) with useful properties; without some degree of oxidation resistance, the substrate would oxidize and cause the ceramic to spall from the substrate surface. Representative of the type of MCrAlY-type bond coatings which are currently used in the gas turbine engine industry are the NiCoCrAlY coating described by Hecht et al in U.S. Pat. No. 3,928,026 and the NiCoCrAlY+Hf+Si coating described by Gupta et al in U.S. Pat. No. 4,585,481.

While the thermal barrier coatings of the type described in the Goward patent have desirable properties, the engine industry continues to seek coatings with even better properties. The present invention satisfies those needs.

SUMMARY OF THE INVENTION

This invention is an improved thermal barrier coated superalloy component. The coating system represents a significant departure from prior art coating systems, and has significantly better properties than the thermal barrier coatings currently used. The component according to this invention consists essentially of a superalloy substrate, a thin adherent oxide scale on the surface of the substrate, and a ceramic coating on the surface of the scale. More particularly, the scale is thermally grown alumina (i.e., aluminum oxide) and the ceramic coating has a columnar grain microstructure. The combination of the adherent thermally grown alumina scale and the columnar grain ceramic coating on the surface of the scale results in a component having significantly improved cyclic oxidation resistance compared to currently used ceramic coated components. Cyclic burner rig tests have shown that components in accord with this invention are about 200 to 300% more durable than the best prior art coated components.

The composition of the superalloy substrate is of particular importance in this invention since it controls the characteristics of the alumina scale which forms upon it. The most important characteristic of the scale, with respect to its effect on the properties of the ceramic coating ultimately applied to the scale, is the bond strength between the scale and the substrate surface. The bond strength must be sufficiently high to enable the scale to withstand repeated cycling between elevated and ambient temperature conditions.

In its most preferred form, the superalloy substrate has a composition which, on a weight percent basis, is 4–7.5 Cr, 3.5–7.5 W, 8–10 Ta, 5–6 Al, 8–12 Co, 0.5–2.5 Mo, 2.5–4 Re, 0.05–0.5 Hf, 0.005–0.054 of the oxygen active elements, balance Ni; the substrate most preferably has a single crystal structure produced by directional solidification techniques. The most preferred ceramic is zirconia (zirconium oxide) partially stabilized with about 7 weight percent yttria (yttrium oxide), and having a columnar grain structure. The ceramic coating is applied by electron beam physical vapor deposition techniques. The alumina scale is formed prior to the deposition of the ceramic, during the beginning part of the physical vapor deposition process.

Other features and advantages of the present invention will be more apparent from the following detailed description of the invention, taken in conjunction with the accompanying drawing.

BRIEF DESCRIPTION OF THE DRAWING

The Figure shows the superior oxidation resistance of components coated in accordance with this invention, as compared to prior art coated components.

BEST MODE FOR CARRYING OUT THE INVENTION

Broadly speaking, components made according to the invention are characterized by a superalloy substrate and a ceramic coating on the substrate. In more specific terms the superalloy substrate has a thin adherent alumina scale on its surface and a columnar grain yttria stabilized zirconia ceramic coating on the surface of the alumina scale.

Articles made in accordance with this invention differ significantly from coated articles of the prior art. Prior art articles are described in, for example, the aforementioned patent to Goward. U.S. Pat. No.

4,321,311 to Strangman describes a prior art columnar grain ceramic coating, and the patents to Wheildon (U.S. Pat. No. 3,006,782) and Perugini (U.S. Pat. No. 3,719,571) describe plasma sprayed ceramic coatings. Articles made in accordance with such prior art patents all include a metallic bondcoating applied to the surface of the substrate; the ceramic coating is then applied to the surface of the bondcoating. Articles of this invention do not include a metallic bondcoating; elimination of the bondcoating is possible, in part, because of the recent development of a new class of oxidation resistant superalloys which form adherent oxide scales on the substrate surface.

In the prior art ceramic coating systems noted above, the metallic bondcoating was required to provide oxidation resistance to the substrate. Application of a ceramic coating directly onto the substrates of the prior art (i.e., omission of the metallic bond coating) was not entirely successful since oxidation of the substrate caused the ceramic coating to spall. But even when such substrates were coated with a bondcoating, properties were not always as good as desired, since failure of the bondcoating was often observed. When the bondcoating failed, eventually so did the ceramic.

The Figure shows the superior cyclic oxidation resistance of components made in accordance with this invention, in comparison to several components of the prior art. The structure of the components tested, and their composition, is summarized in Table I.

Specimen A represents the invention.

Specimen B is representative of the ceramic coating systems described and claimed in the aforementioned patent to Strangman, and is considered to be one of the most oxidation resistant thermal barrier coating systems of the prior art. The Figure shows, however, that components according to this invention (A have markedly superior oxidation resistance compared to the prior art Strangman components (B), as well as other types of coated components. Furthermore, the Figure shows that while the invention specimens (A) which have no metallic bondcoating on the substrate surface performed best of all, the other superalloy compositions were not useful without a metallic bondcoating between the substrate and the ceramic coating. In particular, compare the properties of the invention specimens (A) with the prior art type specimens (B, C, D, E and F). The poor performance exhibited by these prior art type specimens is typical of superalloys which cannot form an adherent alumina scale.

The alumina scale adhered directly to the surface of the superalloy substrate is, therefore, a key feature of this invention. Tests have indicated that the bond strength between the scale and the substrate surface has the greatest effect on the overall properties on the ceramic coating system; the adherent scale formed according to this invention produces a coating system with markedly improved oxidation resistance compared to coating systems of the prior art. Improved oxidation resistance results in improved thermal barrier properties, which is the primary object of this invention. Other important properties of the alumina scale, in terms of the ceramic coating system's performance, include the scale's homogeneity and morphology. These three scale properties, adherency, homogeneity and morphology are significantly influenced by the substrate composition. As a result, only those superalloy compositions which can produce scales having the required properties are useful in carrying out the invention.

For an alumina scale to have the level of adherence required of this invention, it must be able to withstand repeated thermal cycling without spalling from the substrate surface. The required level of adherence is represented by the scale surviving at least about ten continuous cycles between elevated temperatures and ambient conditions without spalling. Ten cycles represents almost an order of magnitude improvement, with respect to scale adherence, over scales in prior art ceramic coating systems (i.e., scales applied to the substrates used with prior art ceramic coating systems.)

To determine whether an alumina scale has sufficient adherence to the substrate to withstand ten cycles of elevated temperature exposure, procedures such as the following are utilized: Prior to the first cycle, the test specimens are cleaned using conventional laboratory methods, to remove any preexisting oxides or other surface contamination. Each cycle consists of exposure to about 1,150° C. (about 2,100° F.) for about 55 minutes in an oxygen containing atmosphere (e.g., in a conventional air furnace) followed by about 5 minutes at room temperature. If the scale is still adherent to the substrate surface after ten continuous cycles, (i.e., there are essentially no indications of spallation when viewed at about $10\times$ magnification) then the scale has the level of adherence required of this invention. Superalloys of the type described in commonly assigned U.S. Pat. No. 4,719,080 to Duhl et al have been found to form adherent aluminum oxide scales, while those such as Alloy 1480 (Specimens B and C in Table I and the Figure), Mar-M200+Hf (Specimen D in Table I and the Figure) B1900+Hf (Specimen E in Table I and the Figure), and Hastelloy Alloy X (Specimen F in Table I and the Figure) do not form adherent alumina scales.

Electron beam microprobe analysis has revealed that the aluminum oxide scales within the scope of this invention are more homogeneous and thinner than scales which do not have the requisite level of bond strength. It is believed that scale homogeneity and thinness are therefore other desirable features of the invention. However, the most important scale property seems to be adherence.

The types of ceramic coatings applied to the surface of the scale are similar to those known in the art; coatings based on partially or fully stabilized zirconia, ceria, magnesia, and calcia are useful. Yttria stabilized zirconia ceramics are the most preferred coating compositions; other materials may also be used to stabilize the zirconia, for example ceria. Plasma (or thermal) spray techniques are known methods for applying ceramic coatings, and can be used in this invention. However, physical vapor deposition (PVD) techniques are preferred, since they produce a ceramic coating having a columnar grain microstructure. Electron beam physical vapor deposition (EB-PVD) techniques are the most preferred techniques for applying the ceramic. Columnar grain ceramic coatings are believed to be most able to withstand thermal-mechanical stresses; for that reason, their morphology is desired in the invention coating system.

The class of superalloys described in the aforementioned patent to Duhl et al are capable of forming the type of alumina scale required by this invention. While other superalloy compositions may also be useful, the Duhl et al nickel base compositions are most preferred, and the contents of U.S. Pat. No. 4,719,080 are incorporated herein by reference. Broadly speaking, such superalloys consist essentially of, by weight percent 3-12

Cr, 3-10 W, 6-12 Ta, 4-7 Al, 0-15 Co, 0-3 Mo, 0-5 Re, 0-0.02 B, 0-0.045 C, 0-0.8 Hf, 0-2 Nb, 0-1 V, 0.0.1 Zr, 0-0.7 Ti, 0-10 of the noble metals, 0-0.1 of scandium, yttrium or the lanthanide or actinide series of elements or mixtures thereof (hereinafter collectively referred to as the oxygen active elements), balance nickel. A more specific composition range is 3-8 Cr, 3-8 W, 6-12 Ta, 4.5-6.5 Al, 6-12 Co, 0.3-3 Mo, 0-5 Re, 0-0.005 B, 0-0.007 Zr, 0-0.02 C, 0-0.5 Hf, 0-0.4 Ti, 0-10 of the noble metals, 0.001-0.1 of the oxygen active elements, balance Ni. The most preferred composition range is 4-7.5 Cr, 3.5-7.5 W, 8-10 Ta, 5-6 Al, 8-12 Co, 0.5-2.5 Mo, 2.5-4 Re, 0.05-0.5 Hf, 0.005-0.054 of the oxygen active elements, balance Ni. Yttrium is the most preferred oxygen active element present in the superalloy compositions used in this invention.

As is made clear in the Duhl et.al. patent, single crystal microstructures are the desired form into which such compositions are cast, since they have the best high temperature strength. However, columnar grain and equiaxed structures may also be useful, as long as the composition is capable of forming the required adherent alumina scale.

The ceramic coating according to this invention is preferably applied by an electron beam physical vapor deposition process. The alumina scale is formed during the EB-PVD process, prior to the time that the ceramic is actually being evaporated by the electron beam and deposited onto the substrate. The scale should be thermally grown, as opposed to being applied as a separate and distinct layer such as by sputtering. To promote the formation of a smooth and uniform thickness thermally grown alumina scale, the surface of the superalloy substrate should be smooth as well as free of any extraneous oxides or other surface contamination. Conventional vapor hone techniques are preferred for cleaning the substrate surface without causing excessive roughness.

As is well known, during an EB-PVD process a beam of electrons is focused by appropriate electromagnetic lenses and caused to impinge upon a target having a desired coating composition. Impingement of the focused beam upon the target heats the target to a temperature above its vaporization point. The target vapors condense upon the surface of the substrate (which is in proximity to the target, and maintained at a temperature less than the temperature of the target) and the vapors solidify in a manner which results in a substantially columnar grain microstructure. The preferred method for applying the thermal barrier coating of this invention is to impinge an unfocused beam of electrons onto the target, while at the same time, bleeding a small but controlled amount of oxygen into the coating chamber. The beam heats the target to a temperature below that at which vaporization takes place, and heat radiated by the target causes the substrate surface to oxidize due to the presence of oxygen in the chamber, and selectively form the adherent, thin alumina scale of this invention. The scale is accordingly called a thermally grown scale. The beam is then focused by the lenses and the target is heated to a temperature sufficient to cause vaporization. The process continues until the desired thickness of ceramic coating is deposited.

During the time that the target is evaporated and the ceramic vapors condense upon the oxide scale, oxygen is continually bled into the coating chamber. As a result, the oxide scale continues to grow (in thickness) as the ceramic is deposited. The final thickness of the alumina scale should be at least about 0.25 microns. It is difficult to define a maximum scale thickness; however, above about 25 microns, the scale will readily fracture when stressed, and such thicknesses should be avoided. (Formation of scales in the range of 25 microns in thickness may not be practical, for reasons, relating to scale formation kinetics.) Accordingly, the alumina scales within the scope of this invention should be from about 0.25 microns to about 20 microns, with thicknesses on the low end of such range being preferred. While formation of the scale by the aforementioned electron beam heating process is preferred, the scale may also be formed by other methods which will be evident to those skilled in the art.

The thickness of the ceramic coating is dependent upon the required thermal barrier characteristics. In most cases, the desired ceramic thickness will range from about 25 to 500 microns, preferably about 250 to 375 microns.

As mentioned above, oxygen is bled into the coating chamber while the thermally grown scale is formed and while ceramic coating is being deposited onto the scale. During the vaporization of a ceramic such as yttria stabilized zirconia, the vaporized molecule sometimes disassociates; when such molecules condense upon the surface of the substrate, the coating may not be stoichiometrically correct, with respect to the amount of oxygen present. Ceramic coatings having poor properties may result from such types of processes. To insure that the ceramic coatings of this invention are stoichiometrically correct (i.e., not oxygen deficient), reactive evaporation techniques are utilized, wherein oxygen is bled into the EB-PVD chamber at a controlled rate during the evaporation process. Techniques of this type are generally described in U.S. Pat. No. 4,676,994 to Demaray, the contents of which are incorporated by reference. According to the preferred reactive evaporation process, oxygen molecules are bled into the chamber in such a manner that they travel in a beam-like fashion towards the substrate, along a path which causes them to collide with the evaporant molecules in the space immediately adjacent to the substrate surface. Collisions near the substrate are desired in order to avoid other collisions which might otherwise reduce the overall coating deposition rate. An enclosure (within the EB-PVD chamber) surrounds the substrate being coated; the enclosure has an opening opposite the substrate which allows excess oxygen molecules to escape from the chamber, which could also reduce the coating deposition rate.

The following examples provide additional information relating to the details of this invention. The examples are not, however, intended to limit the invention.

EXAMPLE 1

Single crystal castings having an approximate composition of 5 Cr—10 Co—1.9 Mo—5.9 W—3 Re—8.4 Ta—5.7 Al—0.35 Hf—0.0125 Y—balance Ni were cleaned using conventional vapor hone techniques and then soap washed, water rinsed and then rinsed with ethyl alcohol. The cleaned specimens were then inserted into an electron beam-physical vapor deposition vacuum chamber and the chamber evacuated to about $10^{-4}$ Torr. An unfocused electron beam was impinged upon the ceramic coating target, which was a bed of yttria stabilized zirconia chips. During such time, oxygen was bled into the chamber, directed towards the casting surface, at a rate of about 400 standard cubic centimeters per minute. The heat generated by the electron beam caused the temperature of the substrate to reach about 870° C. in 10 minutes, during which a thermally grown alumina scale formed on the surface of the substrate; the thickness of the scale was estimated as being in the submicron range (i.e., less than about 1 micron). After the preheating process, and while oxygen was continually bled into the chamber, the electron beam was focused, which caused evaporation of the yttria stabilized zirconia to occur. A columnar grained coating was formed as the vapors condensed upon the substrate. Also, additional growth of the alumina scale took place. The coating process continued for about 60 minutes at about 955° C., and a zirconia coating having a thickness between about 250 to 375 microns was formed.

Conventional burner rig testing at 1135° C. revealed that the specimens coated in this manner had a life to failure (i.e., the time to the first spallation of the ceramic coating) which ranged between about 15,000 and 20,000 cycles, as shown in the Figure, Specimen A. During each cycle, the specimen being tested was heated for about 4 minutes in a flame produced by the combustion of jet fuel, and then cooled by forced air for 2 minutes. The temperature of the specimen was about 1,135° C.; the actual time that the specimen was at the steady-state temperature of 1,135° C. was about 2½ minutes per cycle.

EXAMPLE 2

A thermal barrier coating system was applied to a castings having a nickel base superalloy composition and tested in the same cyclic oxidation test described in Example 1. The superalloy composition, on a weight percent basis, was 10 Cr–5 Co–1.5 Ti–5 Al–4 W–12 Ta–balance Ni, and the castings had a single crystal microstructure. The columnar grained yttria stabilized zirconia ceramic coating described in Example 1 was applied to the surface of the superalloy, in the same manner described in Example 1. There was no MCrAlY-type bond coating between the ceramic coating and the superalloy substrate; however, a thermally grown oxide scale did form on the substrate surface during the ceramic coating deposition. The ceramic spalled from the component surface after the first few burner rig test cycles (see Specimen C in the Figure), indicating that the oxide scale was essentially nonadherent.

EXAMPLE 3

Superalloy castings having the compositions set forth in Examples 1 and 2 were evaluated in cyclic furnace tests to compare the adherency of the alumina scales which formed on their surfaces. Each cycle consisted of about 55 minutes at about 1,150° C. (about 2,100° F.) and 5 minutes of forced air cooling. The scale on Example 1 castings was still adhered to the substrate surface after about 10 cycles of furnace testing, while the scale on Example 2 castings repeatedly spalled and reformed during the first 10 test cycles. The significantly greater bond strength of the Example 1 scales is the reason for the superior cyclic oxidation resistance of the Example 1 thermal barrier coating system as compared to the Example 2 system.

EXAMPLE 4

The cyclic oxidation resistance of what is believed to be the best prior art thermal barrier coating system was compared with that of the invention system. The best prior art system is represented by specimen B in the Figure and Table I, and comprised a NiCoCrAlY+Hf+Si bond coating and a columnar grained yttria stabilized zirconia ceramic coating on the bondcoating surface. The superalloy composition is described in Example 2, and the ceramic coating was applied by electron beam-physical vapor deposition, in the manner described in Example 1. The composition of the bond coating is described in U.S. Pat. No. 4,585,481 to Gupta, and was nominally Ni—22 Co—17 Cr—12.5 Al—0.6 Y—0.25 Hf—0.4 Si. Metallographic examination of the specimens prior to testing indicated that an oxide scale had formed on the surface of the bond coating, and the ceramic coating was applied to the surface of this scale. In cyclic oxidation tests conducted in the same manner as those described in Example 1, the specimens had a life to failure of about 5,000 cycles. Thus, the invention coated components had a life which was at least about 3 times greater than the best prior art coated components.

EXAMPLE 5

Cyclic oxidation studies were conducted to characterize the performance of nickel base superalloys which utilized a diffusion aluminide coating as the bond coat for a subsequently applied yttria stabilized zirconia ceramic coating. The bond coating was a pack aluminide coating, applied with conventional diffusion coating techniques such as those described by Benden et al in U.S. Pat. No. 4,132,816. The substrate composition for these tests is described in Example 2. An electron beam-physical vapor deposited yttria stabilized zirconia coating (7 weight percent yttria) was applied to the aluminided surface using the techniques described in Example 1; during the coating process, a thin oxide scale formed on the surface of the aluminide coating. The specimens failed shortly after cyclic oxidation tests were started, indicative of the relatively poor adherence of the scale to the substrate surface.

The above Examples are provided to illustrate the features and advantages of this invention; they are not meant to limit the scope of the invention. In particular, while the tests carried out have been on nickel base superalloys, it is believed that the same type of results will be achieved with some cobalt base superalloys, as long as the requisite adherent alumina scale can be formed on the substrate surface. Furthermore, while a columnar grained yttria stabilized zirconia coating applied by an electron beam-physical vapor deposition technique is most preferred, it is expected that improvements in cyclic oxidation will be observed with ceramic coatings other than yttria stabilized zirconia and applied by techniques other than electron beam techniques, as long as the superalloy component has on its surface an adherent alumina scale.

Although this invention has been shown and described with respect to detailed embodiments thereof, it will be understood by those skilled in the art that various changes in form and detail thereof may be made without departing from the spirit and scope of the claimed invention.

TABLE I

Thermal Barrier Coating Systems Shown in the FIGURE

| Specimen Designation | Substrate | Bondcoating | Ceramic |
|---|---|---|---|
| A | Ni—5Cr—10Co—1.9Mo—5.9W—3Re—8.4Ta—5.7Al—0.35Hf—0.0125Y | None | $ZrO_2$—$7Y_2O_3$ |
| B | Ni—10Cr—5Co—1.5Ti—5Al—4W—12Ta | NiCoCrAlY + Hf + Si | $ZrO_2$—$7Y_2O_3$ |
| C | Ni—10Cr—5Co—1.5Ti—5Al—4W—12Ta | None | $ZrO_2$—$7Y_2O_3$ |
| D | Ni—9Cr—10Co—2Ti—5Al—2Hf—1Cb—0.14C—0.015B | None | $ZrO_2$—$7Y_2O_3$ |
| E | Ni—8Cr—10Co—1Ti—6Al—6Mo—4.25Ta—1.15Hf—0.11C—0.015B | None | $ZrO_2$—$7Y_2O_3$ |
| F | Ni—22Cr—1.5Co—18.5Fe—9Mo—0.1C—0.6W | None | $ZrO_2$—$7Y_2O_3$ |

We claim:

1. A coated superalloy component consisting essentially of a nickel or cobalt base superalloy substrate, a thin, adherent aluminum oxide scale on the substrate surface, and a ceramic coating on the aluminum oxide scale.

2. The component of claim 1, wherein the aluminum oxide scale is between about 0.25 and 20 microns thick and the ceramic coating is between about 25 and 500 microns thick.

3. The component of claim 2, wherein the aluminum oxide scale is between about 0.25 and 2.5 microns thick and the ceramic coating is between about 125 and 375 microns thick.

4. The component of claim 1, wherein the ceramic has a columnar grain structure and is based on those ceramics in the group consisting of zirconia, ceria, yttria, and mixtures thereof, and wherein the superalloy substrate contains additions of oxygen active elements.

5. A coated superalloy component consisting essentially of a nickel base superalloy substrate, a thin, adherent aluminum oxide scale on the substrate surface, and a columnar grain ceramic coating on the aluminum oxide scale, wherein the superalloy consists essentially of, by weight percent, 4–7.5 Cr, 8–12 Co, 0.5–2.5 Mo, 3.5–7.5 W, 2.5–4 Re, 8–10 Ta, 5–6 Al, 0.05–0.5 Hf, 0.005–0.054 oxygen active elements, balance nickel, and has a single crystal structure, and wherein the ceramic is yttria stabilized zirconia and has a columnar grain structure.

6. The component of claim 5, wherein the aluminum oxide is between about 0.25 and 20 microns thick and the ceramic coating is between about 25–500 microns thick.

* * * * *